United States Patent [19]
Nossen et al.

[11] 3,973,209
[45] Aug. 3, 1976

[54] DIGITAL ARITHMETIC SYNTHESIZER PHASE LOCK LOOP WITH DIRECT DOPPLER AND FREQUENCY READOUT

[75] Inventors: Edward Joachim Nossen, Cherry Hill, N.J.; Eugene Richard Starner, Bethlehem, Pa.

[73] Assignee: RCA Corporation, New York, N.Y.

[22] Filed: Aug. 29, 1975

[21] Appl. No.: 609,004

[52] U.S. Cl............................ 328/14; 324/78 D; 324/82; 235/175; 340/347 AD; 324/83 D
[51] Int. Cl.².......................................... H03B 19/00
[58] Field of Search .............. 328/14; 324/78 D, 82, 324/83 D; 340/347 AD; 235/175

[56] References Cited
UNITED STATES PATENTS

| | | | |
|---|---|---|---|
| 3,689,914 | 9/1972 | Butler | 328/14 X |
| 3,882,403 | 5/1975 | Gerken | 328/14 |
| 3,895,294 | 7/1975 | Vinding | 324/82 |
| 3,898,579 | 8/1975 | Aldridge | 328/14 |
| 3,922,670 | 11/1975 | Shaw et al. | 324/78 D |

*Primary Examiner*—John S. Heyman
*Attorney, Agent, or Firm*—Carl M. Wright; Edward J. Norton

[57] ABSTRACT

Arithmetic frequency synthesizer, for use in a phase locked loop, having a partitioned frequency register to provide direct representation of doppler and repeatibility of frequency. Included are provisions for sweeping a range of signal frequencies of interest to acquire a lock on a desired signal within that range.

6 Claims, 3 Drawing Figures

DIGITAL ARITHMETIC SYNTHESIZER PHASE LOCK LOOP WITH DIRECT DOPPLER AND FREQUENCY READOUT

BACKGROUND OF THE INVENTION

The accurate measurement of the frequency and phase of received signals is important in systems such as radar range and range rate measurement, navigation, and collision avoidance systems. It is also useful in communication systems for extracting bit timing information to permit synchronous detection of digital data streams.

Phase locked oscillators (PLO) provide the best techniques for producing accurate measurement of phase and frequency. Basically, a phase locked oscillator compares the phase of a signal—the received signal in the examples to be discussed below—to the phase of a voltage controlled oscillator (VCO). The resultant phase difference modifies the control voltage of the VCO to change its frequency in a direction that reduces the phase difference.

The accuracy of a PLO can be increased by using digital techniques. The accuracy of a digital system increases with the number of bits used. Frequency limitations are imposed, however, by the speed of the digital devices employed in the system. A basic feature of the digital PLO systems is the generation of a frequency which is controlled by a digital number. The digital number is a function of the phase difference between the VCO output signal and the received signal.

A common PLO technique is the Programmable-Divide-by-N in which the frequency of a reference oscillator is divided and compared to the divided phase difference between the received signal and the VCO output signal. Varying the division ratios varies the frequency of the VCO. If the VCO frequency ($f_s$) is divided by N and the reference frequency ($f_R$) is divided by R, then the VCO output frequency will be $$f_x = (N/R)f_R.$$

Comparing the phase of the VCO output signal to the phase of the received signal produces a phase difference which is converted to a digital number by an analog-to-digital converter. The resulting digital number is N and controls the frequency of the VCO to track the received signal. Therefore, the value of N will be proportional to the received frequency.

Another technique, called Iterative Synthesizing, combines frequencies obtained by multiple divisions of a plurality of reference frequencies. The combinations are controlled by a digital number so that the resulting output frequency is proportional to the digital number. Practically, iterative synthesizers have high resolution, wide tuning range, and high spectral purity but require a large amount of expensive hardware.

Another technique uses an Incremental Phase Modulator to generate a controlled frequency offset from a given reference frequency. The offset is controlled by a digital number. An example of the implementation of this technique would be a tapped delay line, the output signal from each tap being coupled to a separate gate each of which is enabled by a different one of the bits in the controlling digital number. The output signals from all the gates would be combined in a mixer to produce the output frequency. This implementation is called a Serradyne. The frequency at which this type of system operates is determined by the number of taps, phase quantization, and the stability of the tapped delay line. The complexity of the implementation makes this technique unattractive for high resolution systems.

Another approach uses arithmetic techniques to generate the controlling voltage for the VCO. One such system is described in application Ser. No. 462,772 by Bosselaers and assigned to the same assignee as this application. In this technique, an arithmetic unit adds and subtracts programmed counter values as determined by a reference a-c signal and a variable a-c signal derived from the VCO output signal. The output signal from the arithmetic unit is converted from a digital to an analog signal and filtered to apply a controlling voltage to the VCO.

The prior art techniques described above have certain disadvantages, the importance of which depends on the use of a given technique. Specifically, the disadvantages include variations in frequency of the VCO caused by temperature, component value drift, and so on. The VCO drift is compensated for by the loop action and is not apparent, but the produced frequency jacks repeatibility. That is, if a digital register value is proportional to the frequency at one point in time, it will not necessarily have the same proportionality at another point in time because of VCO frequency drift.

The frequency being measured is not represented directly by any digital number in the system (excepting the iterative synthesizer). The frequency of the VCO is controlled by a frequency determining device such as crystal, a tank circuit, or the like. The digital numbers in such systems represent the departure from the center (base or nominal) frequency but, because of oscillator drift, neither the exact frequency nor exact frequency change is known. The techniques described above require extensive hardware with resulting system complexity. This not only increases manufacturing cost but adds to the maintenance cost. The techniques described above do not exhibit phase coherency. As the frequency changes, the loops unlock; some even oscillate (hunt) around the new frequency.

The invention disclosed and described herein is a system that does not require a VCO, avoiding the frequency anomolies associated therewith. Direct digital readout of the frequency or its change (doppler) is available. The system of the invention is simple to construct and exhibits phase coherency. Its accuracy is limited only by external factors such as the system clock.

BRIEF SUMMARY OF THE INVENTION

An input signal and a synthesized signal are compared to produce a signal representing the difference in their phases. The phase difference signal is applied to a first accumulator for accumulating a variable number which is added to a fixed number to produce a frequency number. A second accumulator accumulates successive frequency numbers to produce a digital phase number which is converted to the synthesized signal.

DETAILED DESCRIPTION OF THE INVENTION

Figure 1:
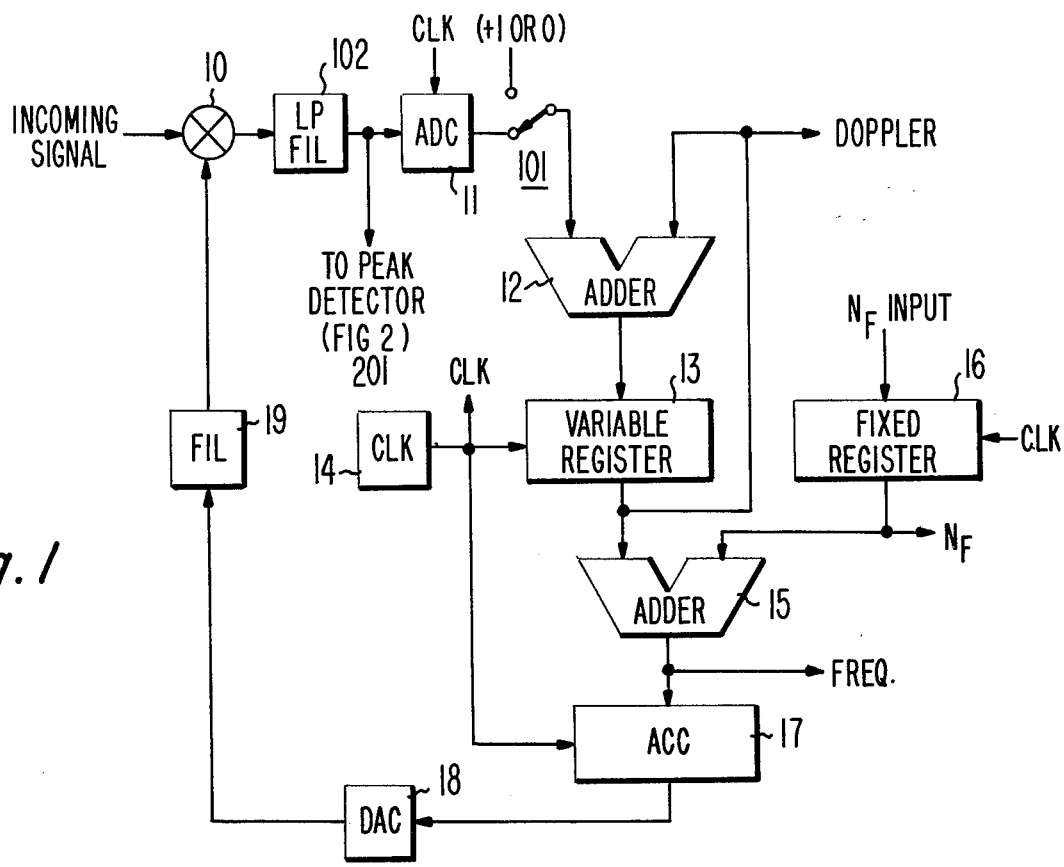
FIG. 1 is a logic diagram of the basic digital phase locked arithmetic synthesizer according to one embodiment of the invention.

In the implementation of the invention shown in FIG. 1, an incoming signal is coupled to a phase comparator 10. The other input signal to the phase comparator 10 is the synthesized signal which will be described below. The output signal from the phase comparator can be an analog or digital signal, depending on the types of input signals. In the embodiment to be described, it is presumed that the output signal from the phase comparator 10 is an analog signal which is low pass filtered and converted to a digital signal by a low pass filter 102 and an analog-to-digital (A/D) converter 11, respectively. A clock pulse from a clock pulse generator 14 is used to determine the points in time at which the analog signals are digitized by the A/D converter 11.

Digital output signals from the A/D converter 11 representing the phase difference between the incoming signal and the synthesized signal are applied to one set of input nodes of an adder 12, the other input signals of which are the output signals from a variable register 13. The output signals from the adder 12 are clocked into the variable register 13 by a clock signal from the clock generator 14. This arrangement of an adder coupled to a register with one adder input operand coupled to the output signal from the register will be referred to as an accumulator. The adder 12 and register 13 can be implemented with readily available commercial integrated circuits such as an SN7482 or SN7483 for the adder and SN7475, SN7477 or SN74100 for the registers (Texas Instruments, Inc.).

The output signals from the variable register 13 also provide input signals to another adder 15. The other input signals to the adder 15 are the output signals from a fixed register 16. The output signals from the adder 15 are coupled to an accumulator 17 which is comprised of an adder and register as herebefore described. The register contents of this stage are usually referred to as the phase number. The output signals from the accumulator 17 are coupled to a digital-to-analog (D/A) converter 18. The analog output signal from the D/A converter 18 is coupled through a filter 19 to the phase comparator 10.

The signal from the filter 19 is a directly synthesized sine wave which is maintained, by the loop described, at the same frequency as the incoming signal. The arithmetic synthesization of a signal is described in detail in U.S. Pat. No. 3,689,914 (Butler) assigned to the same assignee as the present application. The output signal from the adder 15 in FIG. 1 replaces the frequency register shown in the above-identified Butler patent. The accumulator 17, converter 18 and filter 19 operate as described in the Butler patent.

The digital phase error signal at one operand input node of the adder 12 has a sign and magnitude different from zero depending on the difference in phase (or frequency) between the incoming signal and the synthesized signal. The sign can be provided by referencing zero to the most significant bit being set (2's complement arithmetic). This number is added during each clock pulse to the contents from the variable register 13 which are also added to the contents from the fixed register 16 by the adder 15. The resulting output signal from the accumulator 17 produces a synthesized signal having a frequency determined by the value of the output signal from the adder 15. When the synthesized frequency is the same as the frequency of the incoming signal, and the variable register 13 is maintained at a zero value, the output number from the adder 15 will be the value from the fixed register 16. Therefore, the value stored in the fixed register 16 is referred to as the base or nominal frequency number.

The number stored in the variable register 13 represents the doppler or variation from the base or nominal frequency specified by the number in the fixed register 16. Therefore, the variable number is usually much smaller than the fixed number. In a typical embodiment, the variable register 13 might comprise 12 stages whereas the fixed register 16 might comprise 32 stages. The adder inputs are arranged to add the $n$ bits from the variable register 13 to the corresponding least significant $n$ bits of the fixed register 16.

As the frequency of the incoming signal changes, an error signal will be produced in the variable register 13. Since the value stored in the variable register 13 is equal to the change in frequency in the incoming signal, this change can be called doppler. Furthermore, the nominal frequency is represented by the digital numbers stored in the fixed register 16. Therefore, in the system described in FIG. 1, the doppler frequency and the nominal frequency are directly indicated by digital numbers.

The system shown in FIG. 1 produces an output signal from the D/A converter 18 which is essentially a sawtooth waveshape. A complementer, however, can be used in conjunction with the overflow signal to produce a stepped triangular wave output as shown in the Butler patent, supra. If the d-c component of the stepped triangular wave is removed, e.g., by use of a capacitor, the resulting offset stepped triangular wave is a stepped sine wave. Another modification might include the use of a Read Only Memory to perform a table-look up using the output values from the accumulator 17 as addresses to read out output signal values more closely approximating the instantaneous value of a corresponding sine wave. For purposes of illustration, however, the use of a sawtooth waveform can be used.

The accuracy and repeatability of the operation of the system of FIG. 1 depends only on the accuracy and stability of the clock source 14. Since it is well known in the art to produce clock pulses of desirable accuracy, it is clear that the system of FIG. 1 can be made to operate as accurately as desired. This feature of repeatability enables the system to be locked to an exact frequency by properly setting the value of the fixed register 16.

Figure 2:
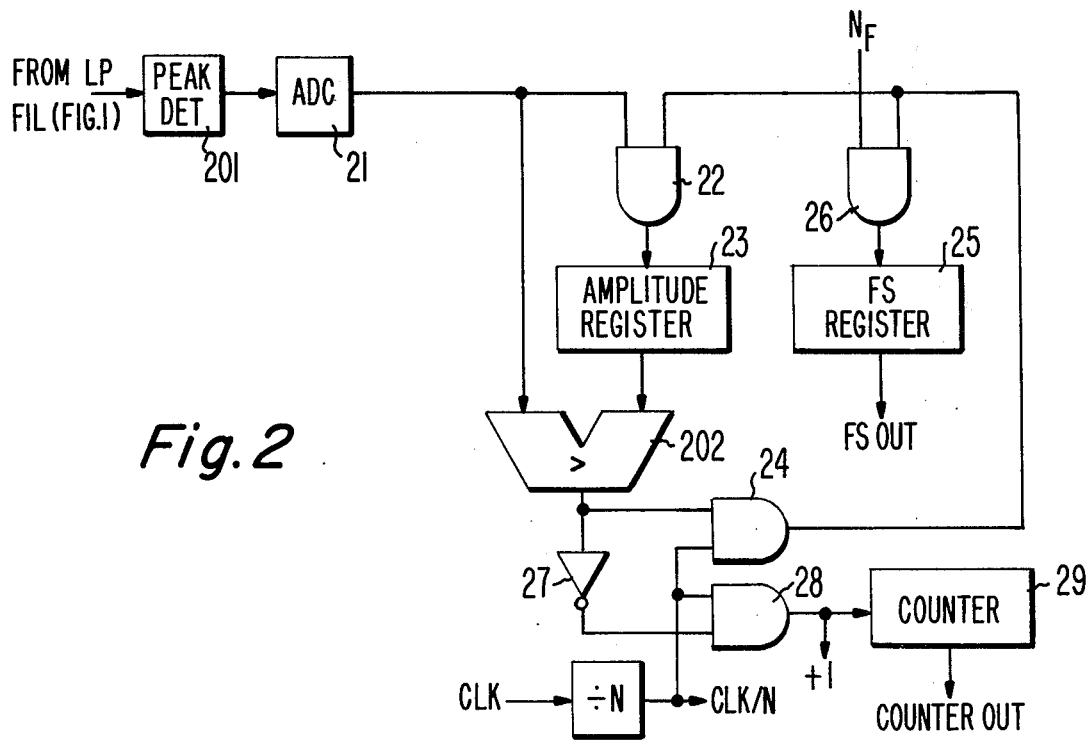
FIGS. 2 and 3 are logic diagrams of apparatus which can be used to perform an acquisition frequency sweep in the system of FIG. 1.
Figure 3:
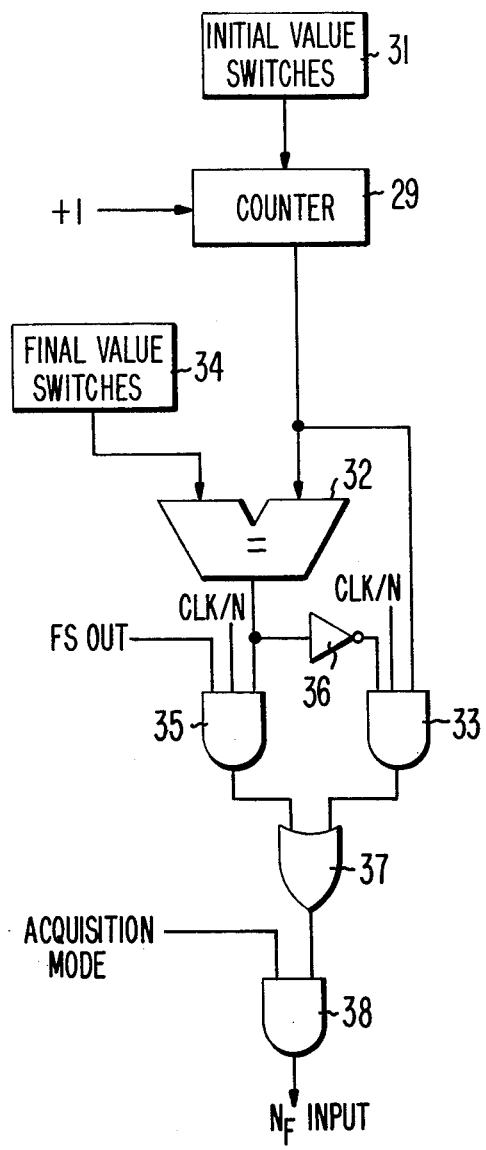

In systems where the input signal frequency is not accurately known, it is desirable to sweep a given range of frequencies to acquire the input signal. If the desired frequency is known to be within the range, it can be assumed that the largest amplitude signal encountered within the range of frequencies being searched is the desired signal. FIGS. 2 and 3 illustrate additional logic which can be used in connection with the logic shown in FIG. 1 to sweep a given range of frequencies.

In FIG. 1, a switch 101 is opened so as to disconnect the input signals to the variable accumulator comprising the adder 12 and register 13. The doppler frequency applied to the adder 15 will thereby be maintained at a zero value. Other ways of accomplishing the same result might be to provide a continuous reset signal to the stages of the variable register 13 or to disconnect the output signals of the variable register 13 from the adder 15.

The contents of the fixed register 16 are set to a value corresponding to the lowest frequency of the range of frequencies to be swept. The incoming signal value is compared to previous values of the incoming signal as the contents of the fixed register 16 are incremented until the fixed register 16 value reaches that corresponding to the highest frequency within the range being swept. The value of the fixed register 16 that corresponds to the largest incoming signal amplitude is then placed in the fixed register 16 and the switch 101 is closed. Because of the repeatability of the synthesized frequency, the system will lock on the incoming signal having the greatest amplitude within the range of frequencies of interest.

FIG. 2 illustrates one embodiment of the additional logic required to perform the functions described above. The signal at the output of the filter 102 (FIG. 1) is applied to a peak detector 201, whose output signal is coupled to an A/D converter 21. The output signals from the converter 21 are coupled to one set of input terminals of a comparator 202 and to an AND gate network 22, the output of the gate network 22 being applied to an amplitude register 23. (A gate network is a plurality of gates having separate and distinct input signals on the input terminal and a common enabling signal on the other. There is one gate per register stage or bus line, for example.)

The other input signals to the comparator 202 are from the amplitude register 23. The comparator 202 produces an output signal of logical one when the incoming signal value from the converter 21 is larger than the value of the output signals from the amplitude register 23; otherwise, it is a logical zero.

The clock pulse is divided by n where n is large enough to produce several cycles of the synthesized frequency. When the output signal from the comparator 202 is a logical one, an AND gate 24 is primed and is enabled by the next nth clock signal. The output signal from the AND gate 24 enables the AND gate network 22 and an AND gate network 26, the other input signals (NF) of which are the output signals from the fixed register 16 of FIG. 1. Enabling the AND gate networks 22 and 26 cause the amplitude of the incoming signal to be stored in the amplitude register 23 and the corresponding value from the fixed register 16 to be stored in an FS register 25, respectively.

Setting the amplitude register 23 to the value of the incoming signal causes the output signal from the comparator 202 to change to a logical zero, which is inverted by an inverter 27 to a logical one to prime an AND gate 28. The output signal from the AND gate 28, when enabled by an nth clock pulse, increments the value in a counter 29. The initial value of the counter 29 is set to a value representing the low frequency in the range of frequencies to be swept. At each nth clock pulse, the contents of the counter 29 are transferred to the fixed register 16 (FIG. 1) to control the synthesized frequency via the $N_F$ input. Each successive comparison of the incoming signal value to the previously stored value in the amplitude register 23 produces a count pulse from the AND gate 28 to increment the counter 29 and, thus, advance the frequency since the counter value is transferred to the fixed register 16. Successive comparisons produce an output signal from the AND gate 24 if the incoming signal is greater than any previous incoming signal which would be stored in the amplitude register 23. The described sequence of operation continues until the counter 29 reaches the maximum value corresponding to the frequency at the high end of the range being swept. At this point, the FS register 25 contains the fixed register value corresponding to the maximum amplitude signal. The FS register contents are then transferred to the fixed register 16 and the loop switch 101 closed.

The counter 29 can be set to the initial value by switches and the final value can be detected by using a comparator with one set of input signals from the counter 29 and the other set of input signals from switches set to the maximum value count. Such comparators, including the comparator 202, are commercially available. (See, for example, device number Am93L24 and application note by Advanced Microdevices, Inc.).

The details of one such embodiment of the fixed register control logic are shown in FIG. 3. The counter 29 (same as counter 29 in FIG. 2) is set to an initial value by a set of initial value switches 31. The output signals from the counter 29 are applied to one set of input terminals of a comparator 32 and to an AND gate network 33.

The other set of input signals to the comparator 32 is from a set of final value switches 34. The output signal from the comparator 32 is a logical one when the sets of input signals have the same value. The comparator 32 output signal is coupled to an AND gate network 35 and its complement, via an inverter 36, to the AND gate network 33. The priming input signals to the AND gate network 35 are the output signals from the FS register 25 (FIG. 2) and, to the AND gate network 33, the counter 29 output signals. The output signals from the AND gate networks 33 and 35, which are enabled by the CLK/N signal, are coupled via an OR gate 37 and an AND gate 38 to the input of the fixed register 16 (FIG. 1) while the system is in the acquisition mode.

Initially, and until the counter reaches the final value, the output signal from the comparator 32 will be a logical zero which, when complemented by the inverter 36, will gate the contents of the counter 29 to the fixed register 16 (FIG. 1) every nth clock pulse.

After the range of frequencies have been swept, the counter 29 value is equal to the final value switches' value so that the output signal from the comparator 32 enables the AND gate network 35 to load the value of the FS register into the fixed register 16 (FIG. 1).

The synthesizer output frequency is thereby at the frequency corresponding to the greatest amplitude signal within the range of frequencies of interest. The switch 101 is then closed, permitting loop action to track the acquired signal.

As a result of the sequence of operations described, the amplitude register 23 will contain the value of the largest amplitude incoming signal within the frequency range of interest and the FS register 25 will contain the corresponding value required to be set in the fixed register 16 to produce the frequency at which the maximum amplitude occurred.

The system described for sweeping the range of interest by incrementing the fixed register 16 can be modified by a person of ordinary skill in the art within the teachings of this invention so as to sweep the range of interest by incrementing the variable register 13. By opening the switch 101, the value in the variable register 13 remains constant since it is added to zero at each clock time. The FS register 25 (FIG. 2) would be used in conjunction with the variable register 13 (FIG. 1) rather than with the fixed register 16. Otherwise, the operation is the same.

A further modification when sweeping the range of frequencies of interest is to couple the adder 12 by means of the switch 101 to a unit value for incrementing the variable digital number stored in the variable register 13. The unit value could be supplied by the output signal for the AND gate 28 (FIG. 2).

It is also within the skill of the art to insert the peak detector 201 (FIG. 2) in the circuit of FIG. 1 so that the A/D converter 21 could be eliminated, its function being performed by the A/D converter 11 (FIG. 1).

Various modifications to the systems and circuits described and illustrated to explain the concepts and modes of practicing the invention might be made by those of ordinary skill in the art within the principles or scope of the invention as expressed in the appended claims.

The invention claimed is:

1. The combination comprising:
    phase comparator means for producing a digital number representing the difference in phase between an input signal and a synthesized signal;
    clock means for producing periodic clock pulses;
    first accumulator means responsive to said clock pulses for accumulating the digital number from said phase comparator means to produce a variable digital number;
    storage means for storing a fixed digital number;
    adder means responsive to said variable and said fixed digital numbers for producing a digital frequency number;
    second accumulator means responsive to said clock pulses for accumulating successive digital frequency numbers to produce a digital phase number; and
    converter means responsive to said digital phase number for producing the synthesized signal.

2. The invention as claimed in claim 1 wherein said converter means includes
    digital-to-analog converter means for producing an analog signal of a value represented by said digital phase number; and
    filter means for removing undesirable frequencies from said synthesized signal.

3. The invention as claimed in claim 1 further including:
    means for maintaining the value of said variable digital number at zero;
    means for incrementing the fixed digital number from an initial value to a final value; and
    circuit means responsive to the input signal peak value for storing the value of the fixed digital number corresponding to the largest value of the peak input signal in the range defined by the initial and final values of the fixed digital number.

4. The invention claimed in claim 3 wherein said circuit means includes:
    amplitude storage means for storing the peak value of the input signal in response to a storage control signal;
    amplitude comparator means responsive to said peak input signal and said amplitude storage means for producing said storage control signal when the input signal peak value exceeds the value stored in said amplitude storage means; and
    fixed value storage means for storing the value of the fixed digital number in response to said storage control signal.

5. The invention as claimed in claim 1 further including:
    means for disconnecting said first accumulator from said phase comparator means;
    means for incrementing said variable digital number from an initial value to a final value; and
    circuit means responsive to the input signal peak value for storing the value of the variable digital number corresponding to the largest value of the peak input signal in the range defined by the inititial and final values of said variable digital number.

6. The invention as claimed in claim 5 wherein said circuit means includes:
    amplitude storage means for storing the peak value of the input signal in response to a storage control signal;
    amplitude comparator means responsive to said peak input signal and said amplitude storage means for producing said storage control signal when the input signal peak value exceeds the value stored in said amplitude storage means; and
    variable value storage means for storing the value of the variable digital number in response to said storage control signal.

* * * * *